(12) United States Patent
Chen et al.

(10) Patent No.: US 11,906,092 B2
(45) Date of Patent: Feb. 20, 2024

(54) QUICK-DISCONNECT ASSEMBLY FOR A FLUID LINE IN A SERVER

(71) Applicant: Quanta Computer Inc., Taoyuan (TW)

(72) Inventors: Chao-Jung Chen, Taoyuan (TW);
Chih-Hsiang Lee, Taoyuan (TW);
Wei-Pin Chen, Taoyuan (TW); Jyue Hou, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 100 days.

(21) Appl. No.: 17/804,772

(22) Filed: May 31, 2022

(65) Prior Publication Data

US 2023/0304618 A1    Sep. 28, 2023

Related U.S. Application Data

(60) Provisional application No. 63/269,956, filed on Mar. 25, 2022.

(51) Int. Cl.
*H05K 7/20* (2006.01)
*F16L 37/127* (2006.01)

(52) U.S. Cl.
CPC ........ *F16L 37/127* (2013.01); *H05K 7/20272* (2013.01); *H05K 7/20781* (2013.01)

(58) Field of Classification Search
CPC ... F16L 37/12; F16L 37/1205; F16L 37/1215; F16L 37/127; F16L 37/1225; F16L 37/18; F16L 37/20; F16L 2201/20; H05K 7/20272; H05K 7/20781
See application file for complete search history.

(56) References Cited

U.S. PATENT DOCUMENTS 325,686 A * 9/1885 May et al. .............. F16L 37/20
285/311

\* cited by examiner

*Primary Examiner* — Aaron M Dunwoody
(74) *Attorney, Agent, or Firm* — NIXON PEABODY LLP

(57) ABSTRACT

A quick-disconnect (QD) connector is configured for a server having electronic modules and an internal fluid circulation system for circulating fluid to cool the electronic modules. The QD connector comprises a first manifold, a second manifold, and a mating actuator. The second manifold is removably connected to the first manifold. The fluid is flowable within the internal fluid circulation system of the server in response to the first manifold and the second manifold being in a connected state. The mating actuator includes a handle and a buckle attached to the handle. The handle is movably coupled to the first manifold so as to be movable from a first position to a second position. The buckle is configured to engage the second manifold and to move the first and second manifolds into the connected state in response to the handle being moved from the first position to the second position.

20 Claims, 4 Drawing Sheets

QUICK-DISCONNECT ASSEMBLY FOR A FLUID LINE IN A SERVER

CROSS-REFERENCE TO RELATED APPLICATIONS

This application claims priority under 35 U.S.C. § 119 to U.S. Provisional Application No. 63/269,956, entitled "FORCE-SAVING MECHANISM FOR QD CONNECTORS," and filed on Mar. 25, 2022. The contents of that application are hereby incorporated by reference in their entirety.

FIELD OF THE INVENTION

The present invention relates generally to fluid lines in a server and, in particular, to a quick-disconnect assembly requiring a reduced manual force for operation.

BACKGROUND OF THE INVENTION

Server products contain various types of electronic equipment, such as processors and memory devices, that are mounted in a server chassis. As the function of these electronics increases, the power consumption increases, leading to the generation of higher levels of waste heat. Because the physical space within a server chassis is confined, there is often not enough space to provide adequate airflow to remove the waste heat with fans and air ducts. Consequently, many server products rely on liquid cooling systems to more efficiently remove the waste heat from the electronics.

Liquid cooling systems may present problems because they introduce fluids near the sensitive electronics within the server. Because various portions of the fluid lines are required to be disconnected and reconnected, the fluid lines often utilize quick disconnect fittings, which are also known as quick connects or quick-release couplings (hereinafter "QD connectors"). QD connectors reduce downtime during accessory or equipment changeovers, simplify servicing, and reduce opportunities for leakage. Unlike other types of fluid line fittings, QD connectors do not require tools for assembly or disassembly.

The main disadvantage of QD connectors is the mating force required for proper connection. The mating force is dependent on the dimensions of QD connectors, the liquid pressure within the fluid lines, and the fluid flow rate. Larger QD connectors require larger mating forces, which can become difficult to accomplish manually by hand.

As one example, QD connectors used in servers may require 12 to 15 kilogram-force (kgF) to attach the two connectors. As such, an operator must apply 12 to 15 kgF on the QD connectors to service the server, which can become exhausting, especially when the operator must repeatedly disconnect and reconnect several QD connectors. Moreover, if the QD connector is located in a physical space that is insufficient for operators to manipulate his or her hands, the connection and reconnection process can become difficult.

The present disclosure is directed to an improved QD connector assembly that permits the operator to use less force to manipulate the QD connector assembly and can be particularly beneficial when the QD connector is located in confined spaces.

SUMMARY OF THE INVENTION

The term embodiment and like terms are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings and each claim.

According to one aspect of the present disclosure, a server has electronic modules producing waste heat and an internal fluid circulation system for cooling the electronic modules. The server comprises a chassis, a QD connector, and a manual mating actuator. The chassis defines a region in which the electronic modules are located. The chassis includes a fluid inlet-port region for receiving fluid for the internal fluid circulation system and a fluid outlet-port region for removing the fluid from the internal fluid circulation system. The QD connector is associated with at least one of the fluid inlet-port region and the fluid outlet-port region. The QD connector is fluidically coupled to the internal fluid circulation system. The QD connector includes a fixed manifold coupled to the chassis and a removable manifold that is removably connected to the fixed manifold. The fluid is flowable through the fixed manifold and the removable manifold in response to the fixed manifold and the removable manifold being in a connected state. The manual mating actuator is associated with the QD connector. The manual mating actuator includes a handle and a buckle. In response to the handle being moved from a first position to a second position, the buckle moves the removable manifold into the connected state with fixed manifold.

According to a configuration of the above implementation, the handle and the buckle are connected at a hinge.

According to another configuration of the above implementation, the handle moves from the first position to the second position around a pivot point.

According to a further configuration of the above implementation, the pivot point is located on the removable manifold.

In a further aspect of the above implementation, the buckle engages the fixed manifold when the handle is moved from the first position to the second position to pull the removable manifold toward to the fixed manifold.

In yet a further aspect of the above implementation, the fixed manifold includes a groove for receiving the buckle.

In another aspect of the above implementation, the buckle includes a curved latch. One of the fixed and removable manifolds includes a circumferentially arranged groove for receiving the curved latch when the handle is moved from the first position to the second position.

According to a further configuration of the above implementation, the handle is attached to one of the fixed and removable manifolds. The buckle is releasably coupled to the other of the fixed and removable manifolds.

According to another configuration of the above implementation, in response to moving the handle from the second position to the first position, the buckle is releasable from the other of the fixed and removable manifolds.

In yet a further aspect of the above implementation, the fixed and removable manifolds include mating portions that automatically permit fluid flow when the fixed manifold and the removable manifold are in the connected state. The mating portions automatically prohibit fluid from leaking when the fixed manifold and the removable manifold are in a disconnected state.

In another aspect of the present disclosure, a QD connector is configured for a server having electronic modules and an internal fluid circulation system for circulating fluid to cool the electronic modules. The QD connector comprises a first manifold, a second manifold, and a mating actuator. The second manifold is removably connected to the first manifold. The fluid is flowable within the internal fluid circulation system of the server in response to the first manifold and the second manifold being in a connected state. The mating actuator includes a handle and a buckle attached to the handle. The handle is movably coupled to the first manifold so as to be movable from a first position to a second position. The buckle is configured to engage the second manifold and to move the first and second manifolds into the connected state in response to the handle being moved from the first position to the second position.

According to another aspect of the above implementation, the handle pivotably moves around a pivot connection point on the first manifold.

According to a further aspect of the above implementation, the handle and the buckle are connected at a hinge.

According to yet a further aspect of the above implementation, the buckle includes a latch that engages a groove in the second manifold.

According to another configuration of the above implementation, the latch is a curved latch and the groove is a circumferentially arranged groove on the second manifold that is configured to receive the curved latch.

According to another configuration of the above implementation, in response to moving the handle from the second position to the first position, the buckle is releasable from the second manifold.

According to yet a further aspect of the above implementation, the first and second manifolds include channel portions that automatically permit fluid flow when the first and second manifolds are in the connected state. The channel portions automatically prohibit fluid from leaking when the first and second manifolds are in a disconnected state In a further aspect of the present disclosure, a method of connecting first and second manifolds of a QD connector for a server having electronic modules includes initially engaging a first channel portion of the first manifold with a second channel portion of the second manifold. The method further includes moving a buckle into engagement with a portion of the second manifold. The buckle is coupled to a handle. The handle is in a first position when the buckle is moved into engagement with the second manifold. The method further includes moving the handle from the first position to a second position so as to cause the first and second manifolds to be moved together and placed in a connected state.

According to a further aspect of the above implementation, the handle and the buckle are coupled at a hinge.

According to yet a further aspect of the above implementation, the handle is connected to the first manifold at a pivot point. The moving includes pivoting the handle around the pivot point from the first position to the second position.

In yet a further aspect of the present disclosure, a QD connector is configured for allowing fluid to flow therethrough. The QD connector comprises a first manifold, a second manifold, and a mating actuator. The second manifold is removably connected to the first manifold. The fluid is flowable through the QD connector in response to the first manifold and the second manifold being in a connected state. The mating actuator includes a handle and a buckle attached to the handle. The handle is movably coupled to the first manifold so as to be movable from a first position to a second position. The buckle is configured to engage the second manifold and to move the first and second manifolds into the connected state in response to the handle being moved from the first position to the second position. The QD connector is useful in various fluidic applications, such as when fluid is circulated to remove heat from components (e.g., within a server).

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of exemplary embodiments together with reference to the accompanying drawings. These drawings depict only exemplary embodiments, and are therefore not to be considered as limitations on the scope of the various embodiments or claims.

Figure 1:
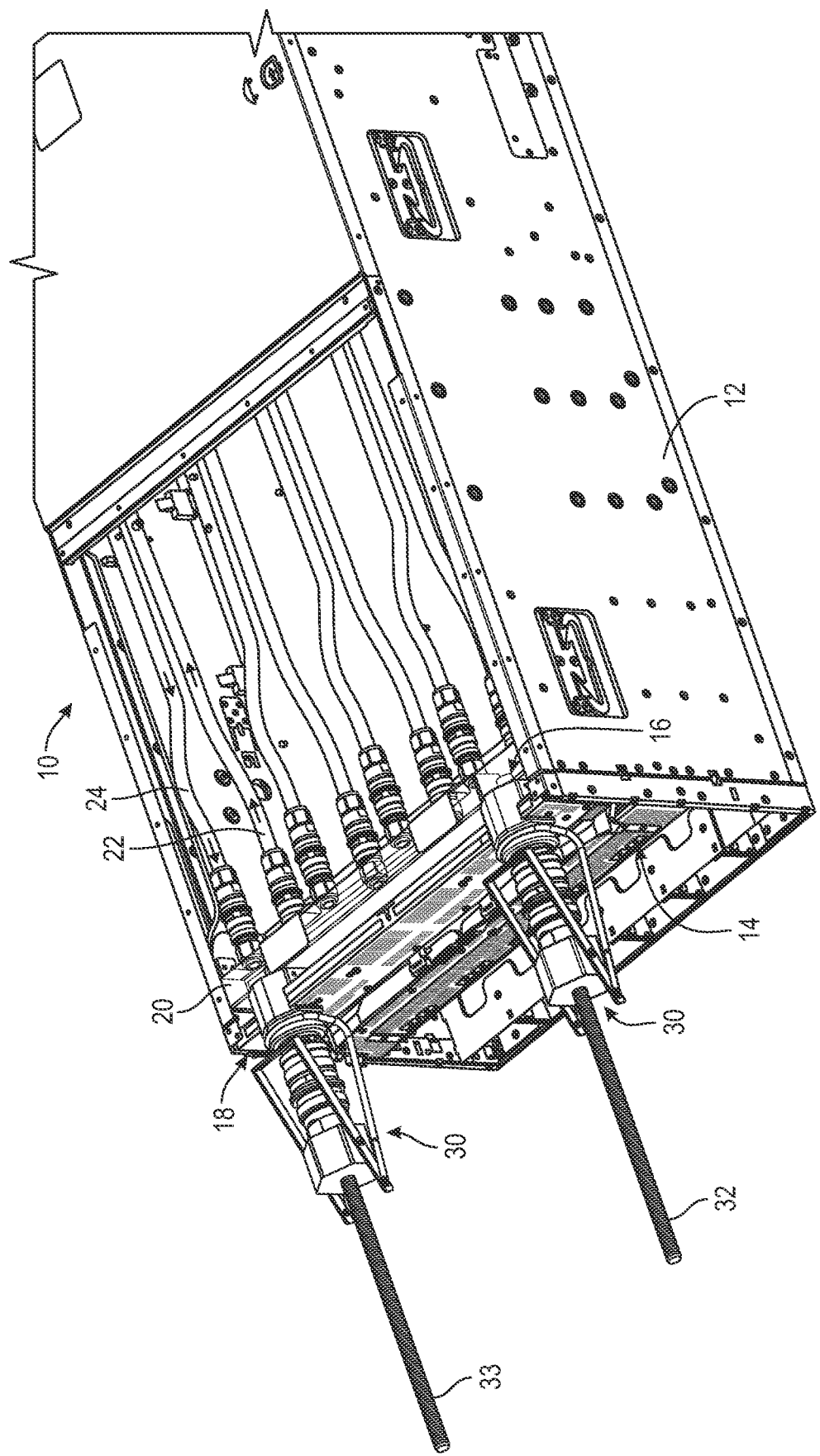
FIG. 1 is a perspective view of a server with a fluid-circulation system that uses the QD connector assembly, in accordance with one embodiment of the present disclosure.

While the invention is susceptible to various modifications and alternative forms, specific implementations have been shown by way of example in the drawings and will be described in further detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION

Various embodiments are described with reference to the attached figures, where like reference numerals are used throughout the figures to designate similar or equivalent elements. The figures are not drawn to scale and are provided merely to illustrate the instant invention. Several aspects of the invention are described below with reference to exemplary applications for illustration. It should be understood that numerous specific details, relationships, and methods are set forth to provide a full understanding of the invention. One having ordinary skill in the relevant art, however, will readily recognize that the invention can be practiced without one or more of the specific details, or with other methods. In other instances, well-known structures or operations are not shown in detail to avoid obscuring the invention. The various embodiments are not limited by the illustrated ordering of acts or events, as some acts may occur in different orders and/or concurrently with other acts or events. Furthermore, not all illustrated acts or events are required to implement a methodology in accordance with the present invention.

Elements and limitations that are disclosed, for example, in the Abstract, Summary, and Detailed Description sections, but not explicitly set forth in the claims, should not be incorporated into the claims, singularly, or collectively, by implication, inference, or otherwise. For purposes of the present detailed description, unless specifically disclaimed, the singular includes the plural and vice versa. The word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof.

FIG. 1 illustrates a perspective view of a server 10 having a chassis 12 that contains various electronic modules 14 at different locations within the chassis 12. The electronic modules 14 may include printed circuit boards and various electronic components that create heat, such as memory devices and processors.

When considering the various components on the electronic modules 14 within the server 10, some components (e.g., processors) produce more waste heat and are more sensitive to temperature than other components, thereby requiring specific attention to maintain them at suitable operating temperatures. To maintain these components within the proper operating temperature range, the chassis 12 includes an inlet port 16 and an outlet port 18 that permit the circulation of a cooling fluid to and from a server fluid manifold 20. The server fluid manifold 20 provides fluid to one or more fluid supply lines 22 that carry the fluid to locations (e.g., heat exchangers) within the chassis 12 that provide the necessary temperature control for certain electronic components. The heated fluid is then returned back to the server fluid manifold 20 via a fluid return line 24. The heated fluid is then removed from the server 10 via the outlet port 18 where it is cooled and subsequently returned in a cooled state to the inlet port 16.

As shown in FIG. 1, the server 10 includes a QD connector assembly 30 at the inlet port 16 and the outlet port 18. The QD connector assemblies 30 facilitate the flow of a coolant fluid with the server 10 via a server supply line 32 and a server return line 33. As described in detail below with reference to FIGS. 2A-2E, each QD connector assembly 30 makes it easier for the operator to manipulate the QD connector assembly 30 during attachment and detachment.

In the illustrated embodiment of FIG. 1, the fluid circulation system within the server 10 includes four pairs of supply lines 22 and return lines 24. However, many variations to the fluid circuit can be employed in accordance with the QD connector assembly 30 of the present disclosure. For example, the QD connector assembly 30 of the present disclosure can also be used on servers and systems having multiple manifolds in different regions of the chassis 12, or that lack a manifold all together (e.g., a single fluid line is used to enter the server 10, cool the components within the server 10, and exit from the server 10 at a different location). Further, though the location of the inlet port 16 and the outlet port 18 are shown on a single side of the chassis 12, these ports may be positioned in other areas of the server 10 and still be used with the QD connector assembly 30 of the present disclosure.

FIG. 2A-2E illustrate the QD connector assembly 30 associated with the supply line 32 and the input port 16 in FIG. 1 in different states of connection. The same structure and functionality described below is equally applicable to the QD connector assembly 30 associated with the return line 33 and the outlet port 18 in FIG. 1.

Figure 2A:
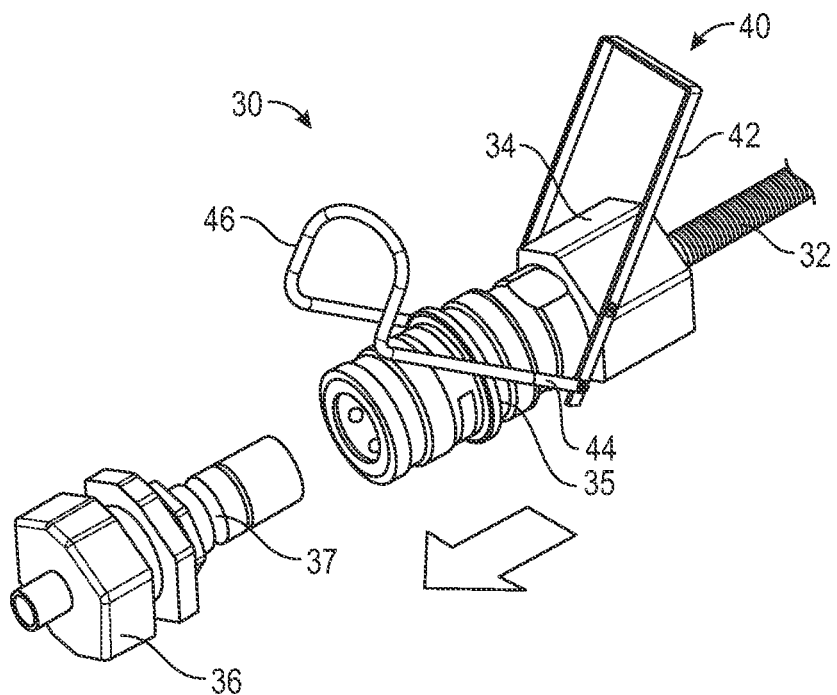
FIG. 2A is perspective view of the QD connector assembly of FIG. 1 in a disconnected state.

As shown in FIG. 2A, the QD connector assembly 30 is fluidically coupled to the supply line 32 by a first manifold 34 that moves with and is attached to the supply line 32. The first manifold 34 includes a first channel portion 35 that includes the structural features associated with a typical QD connector. A second manifold 36 is fixed to the chassis 12 (shown in FIG. 1) and, in the illustrated embodiment, remains stationary relative to the chassis 12. The second manifold 36 includes a second channel portion 37 that slides within and mates with the first channel portion 35. When the first and second manifolds 34 and 36 are fully attached, the first and second channel portions 35, 37 are locked in place and allow fluid to pass without leaking. The QD connector assembly 30 can be a variety of types of devices that comprise internal valves (or other fluid restriction couplings) within the first and second channel portions 35, 37 that automatically open and close when the first and second manifolds 34 and 36 are connected and disconnected, respectively.

The QD connector assembly 30 further includes a manual mating actuator 40 that includes a handle 42 and a buckle 44. The end region of the buckle 44 includes a latch 46 that is preferably curved and has a radius of curvature similar to the second manifold 36 to which to will be coupled. As described below, the manual mating actuator 40 permits the operator to easily connect and disconnect the first and second manifolds 34, 36.

Figure 2B:
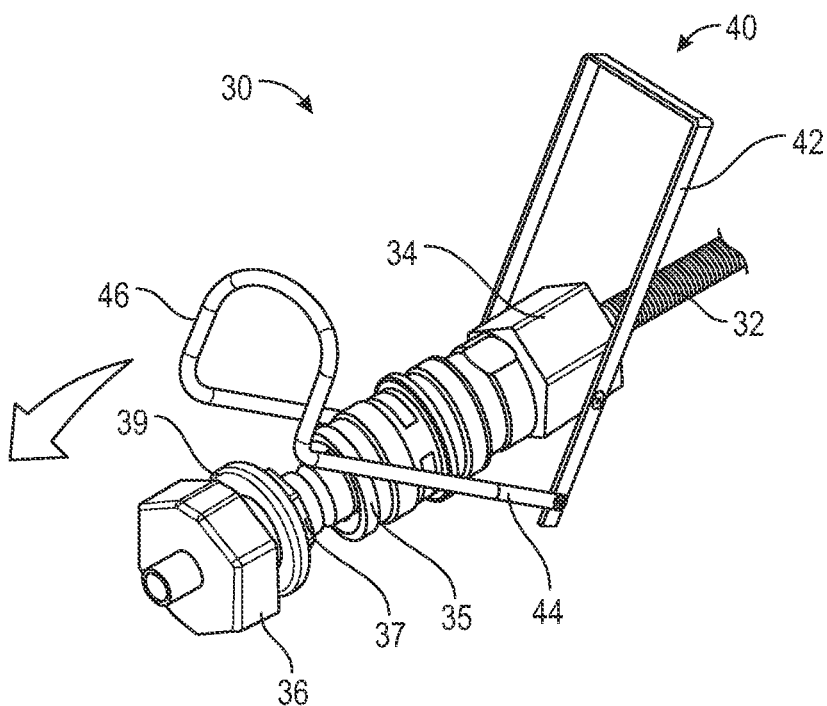
FIG. 2B is perspective view of the QD connector assembly of FIG. 1 in the process of being connected.
Figure 2C:
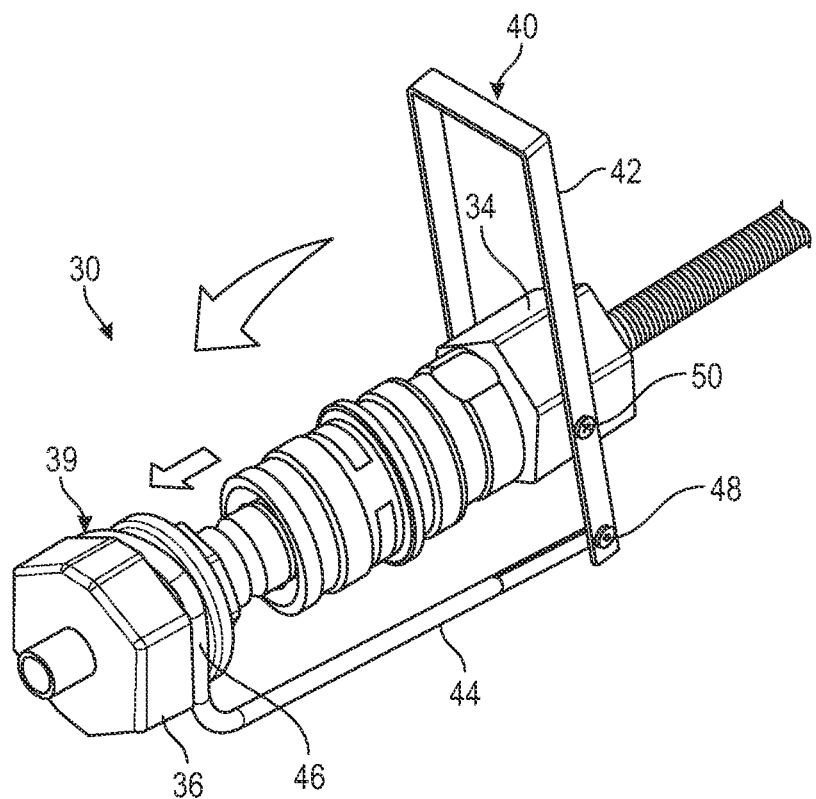
FIG. 2C is perspective view of the QD connector assembly of FIG. 1 in the process of being connected after the buckle is engaged on the second manifold.

As shown in FIG. 2B, once the second channel portion 37 of the second manifold 36 initially slides within and begins to mate with the first channel portion 35, the latch 46 of the buckle 44 is within the vicinity of a circumferential groove 39 in the second manifold 36. At that point, the operator can move the buckle 44 downwardly as shown by the arrow in FIG. 2B and position the latch 46 within the circumferential groove 39 as shown in FIG. 2C. To start the connection process, the operator simply needs to insert the second channel portion 37 into the first channel portion 35, and then move the latch 46 of the buckle 44 downwardly into the groove 39 on the second manifold 36, as shown in FIG. 2B.

Figure 2D:
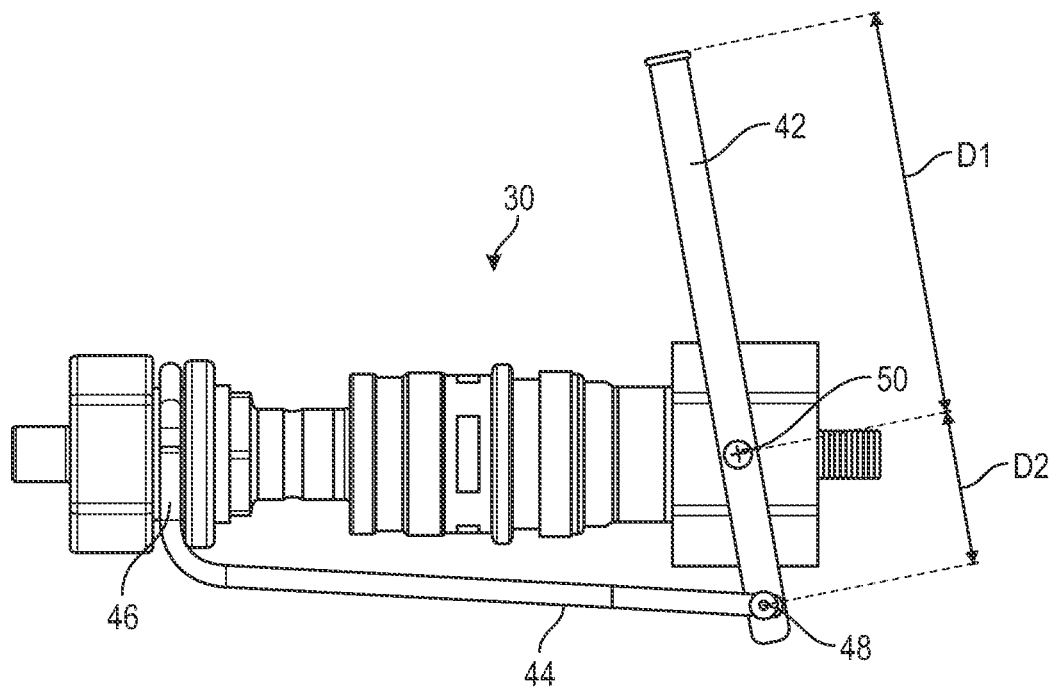
FIG. 2D is side view of the QD connector assembly in the process state of FIG. 2C.

FIG. 2D is a side view of the QD connector assembly 30 of FIG. 2C and helps to illustrate the mechanics of the handle 42 and the buckle 44. The handle 42 is connected to the buckle 44 by a pair of hinges 48 (only one hinge 48 is shown in FIGS. 2C and 2D; the other is on the opposite side of the QD connector assembly 30). The handle 42 include a pivot 50, which acts as a fulcrum for the handle 42. The distances D1 and D2 on the arm of handle 42 are defined by the relative location of the pivot 50 on the handle 42. The distances D1 and D2 are chosen so as to produce a certain amount of pulling force on the buckle 44 when a lesser amount of force is applied to the handle 42 by the operator.

Figure 2E:
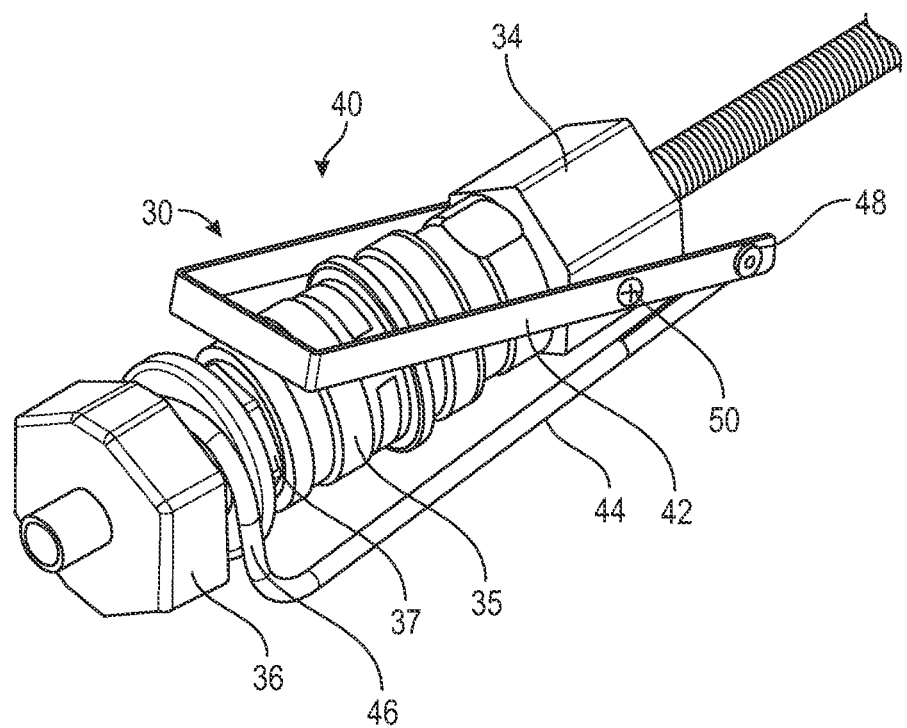
FIG. 2E is perspective view of the QD connector assembly in which the two manifolds are in the connected state.

FIG. 2E illustrates the QD connector assembly 30 after the operator actuates the manual mating actuator 40 and moves the handle 42 from the opened position to the closed position. By rotating the handle 42 around the pivot 50, the buckle 44 and its latch 46 pull the second manifold 36 toward the first manifold 34. Consequently, the first and second channel portions 35, 37 of the first and second manifolds 34, 36 are in a connected state, such that the fluid can flow into and from the fluid circulation system of the server 10 (shown in FIG. 1). Conversely, when the handle 42 is rotated from the closed position of FIG. 2E to the opened position of FIG. 2C, the first and second manifolds 34, 36 are detached from each other and fluid flow is automatically prohibited due to the internal valve arrangement within the first and second manifolds 34, 36.

By use of the manual mating actuator 40, the operator manipulating the QD connector assembly 30 is required to exert much less force during the connection and disconnection process than a typical QD connector. Furthermore, there is less physical movement of the QD connector assembly 30 (i.e., just pivoting the handle 42) that is needed due to the manual mating actuator 40, such that the QD connector assembly 30 can be installed in tight spaces. In one embodiment, the manual mating actuator 40 allows the connection of the first and second manifolds 34, 36 with an amount of force that is less 5 kgF, and preferably less than 3 kgF, whereas a similar QD connector would typically require 12 to 15 kilogram-force (kgF) if the manual mating actuator 40 is not incorporated. As noted above, the amount of force required by the manual mating actuator 40 can be dictated by modify the distances D1 and D2 in FIG. 2D. In one example, the outer dimensions of the first and second manifolds 34, 36 are less than about 1.25 inch (e.g., 1.0 inch) in diameter to serve a fluid line having an inside diameter of about 0.5 inch. In this example, the distance D1 is between 4 inches and 5 inches (e.g., about 4.7 inch), the distance D2 is between 1 inch and 2 inches (e.g., about 1.6 inch), and the overall length of the buckle 44 from the hinge 48 to the latch 46 is about 6 inches to 7 inches (e.g., about 6.3 inch).

The pivot 50 is shown as being positioned on the first manifold 34 by use of a pin or small screw. However, the pivot 50 can be located on the chassis 12 of the server 10. In such an arrangement, the manual mating actuator 40 is attached to the chassis 12 adjacent to the first manifold 34. Furthermore, the manual mating actuator 40 can be used in configurations in which the first and second manifolds 34, 36 are both free to move relative to the chassis 12 of the server 10 (i.e., the second manifold 36 is not fixed relative to the chassis 12).

Furthermore, though the present disclosure has been illustrated relative to the server 10, the manual mating actuator 40 for the QD connector assembly 30 can be used in other applications in which QD connectors are used, such as laser systems, biomedical devices, instruments, etc. In other embodiments, the QD connector assembly 30 having the manual mating actuator 40 can be used in any heat exchanger arrangement in which a fluid is flowing from fluid lines to and from the heat exchanger. The QD connector assembly 30 having the manual mating actuator 40 in accordance with the present invention also has equal application to fluid systems in which the fluid is not used for cooling, but serves other purposes.

The foregoing description of the embodiments, including illustrated embodiments, has been presented only for the purpose of illustration and description and is not intended to be exhaustive or limiting to the precise forms disclosed. Numerous modifications, adaptations, and uses thereof will be apparent to those skilled in the art.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present invention have been described above, it should be understood that they have been presented by way of example only, and not limitation. Numerous changes to the disclosed embodiments can be made in accordance with the disclosure herein, without departing from the spirit or scope of the invention. Thus, the breadth and scope of the present invention should not be limited by any of the above described embodiments. Rather, the scope of the invention should be defined in accordance with the following claims and their equivalents.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

What is claimed is:

1. A server having electronic modules producing waste heat and an internal fluid circulation system for cooling the electronic modules, the server comprising:
   a chassis defining a region in which the electronic modules are located, the chassis including a fluid inlet-port region for receiving fluid for the internal fluid circulation system and a fluid outlet-port region for removing the fluid from the internal fluid circulation system;
   a quick-disconnect (QD) connector associated within at least one of the fluid inlet-port region and the fluid outlet-port region, the QD connector being fluidically coupled to the internal fluid circulation system, the QD connector including a fixed manifold coupled to the chassis and a removable manifold that is removably connected to the fixed manifold, the fluid being flowable through the fixed manifold and the removable manifold in response to the fixed manifold and the removable manifold being in a connected state; and
   a manual mating actuator associated with the QD connector, the manual mating actuator including a handle and a buckle, and wherein, in response to the handle being moved from a first position to a second position, the buckle moves the removable manifold into the connected state with fixed manifold.

2. The server of claim 1, wherein the handle and the buckle are connected at a hinge.

3. The server of claim 2, wherein the handle moves from the first position to the second position around a pivot point.

4. The server of claim 3, wherein the pivot point is located on the removable manifold.

5. The server of claim 4, wherein the buckle engages the fixed manifold when the handle is moved from the first position to the second position to pull the removable manifold toward to the fixed manifold.

6. The server of claim 5, wherein the fixed manifold includes a groove for receiving the buckle.

7. The server of claim 1, wherein the buckle includes a curved latch, and wherein one of the fixed and removable manifolds includes a circumferentially arranged groove for receiving the curved latch when the handle is moved from the first position to the second position.

8. The server of claim 1, wherein the handle is attached to one of the fixed and removable manifolds, and the buckle is releasably coupled to the other of the fixed and removable manifolds.

9. The server of claim 8, wherein, in response to moving the handle from the second position to the first position, the buckle is releasable from the other of the fixed and removable manifolds.

10. The server of claim 1, wherein the fixed and removable manifolds include mating portions that automatically permit fluid flow when the fixed manifold and the removable manifold are in the connected state, and automatically prohibit fluid from leaking when the fixed manifold and the removable manifold are in a disconnected state.

11. A server comprising:
a chassis configured to receive electronic modules;
an internal fluid circulation system configured to circulate a fluid that cools the electronic modules; and
a quick-disconnect (QD) connector including
a first manifold;
a second manifold that is removably connected to the first manifold, the fluid being flowable within the internal fluid circulation system of the server in response to the first manifold and the second manifold being in a connected state; and
a mating actuator including a handle and a buckle attached to the handle, the handle being movably coupled to the first manifold so as to be movable from a first position to a second position, the buckle configured to engage the second manifold and to move the first and second manifolds into the connected state in response to the handle being moved from the first position to the second position.

12. The server of claim 11, wherein the handle pivotably moves around a pivot connection point on the first manifold.

13. The server of claim 11, wherein the handle and the buckle are connected at a hinge.

14. The server of claim 13, wherein the buckle includes a latch that engages a groove in the second manifold.

15. The server of claim 14, wherein the latch is a curved latch and the groove is a circumferentially arranged groove on the second manifold that is configured to receive the curved latch.

16. The server of claim 11, wherein, in response to moving the handle from the second position to the first position, the buckle is releasable from the second manifold.

17. The server of claim 11, wherein the first and second manifolds include channel portions that automatically permit fluid flow when the first and second manifolds are in the connected state, and that automatically prohibit fluid from leaking when the first and second manifolds are in a disconnected state.

18. A method of connecting first and second manifolds of a quick-disconnect (QD) connector that provides fluid to a server having electronic modules, the method comprising:
initially engaging a first channel portion of the first manifold with a second channel portion of the second manifold;
moving a buckle into engagement with a portion of the second manifold, the buckle being coupled to a handle, the handle being in a first position when the buckle is moved into engagement with the second manifold; and
moving the handle from the first position to a second position so as to cause the first and second manifolds to be moved together and placed in a connected state.

19. The method of claim 18, wherein the handle and the buckle are coupled at a hinge.

20. The method of claim 18, wherein the handle is connected to the first manifold at a pivot point, the moving including pivoting the handle around the pivot point from the first position to the second position.

* * * * *